(12) United States Patent
Joo

(10) Patent No.: US 6,365,467 B1
(45) Date of Patent: Apr. 2, 2002

(54) METHOD OF FORMING GATE OXIDE LAYER IN SEMICONDUCTOR DEVICE

(75) Inventor: Moon Sig Joo, Kyoungki-do (KR)

(73) Assignee: Hyundai Electronics Industries Co., Ltd., Ich'on (KR)

(*) Notice: Subject to any disclaimer, the term of this patent is extended or adjusted under 35 U.S.C. 154(b) by 0 days.

(21) Appl. No.: 09/436,780

(22) Filed: Nov. 8, 1999

(30) Foreign Application Priority Data

Dec. 30, 1998 (KR) .............................. 98-61868

(51) Int. Cl.⁷ .................. H01L 21/8238; H01L 21/336; H01L 21/3205; H01L 21/4763
(52) U.S. Cl. .................. 438/287; 438/216; 438/591
(58) Field of Search .................. 438/216, 261, 438/287, 591

(56) References Cited

U.S. PATENT DOCUMENTS

| | | | |
|---|---|---|---|
| 4,257,832 A | 3/1981 | Schwabe et al. | 148/187 |
| 4,306,353 A | 12/1981 | Jacobs et al. | 29/571 |
| 5,104,819 A * | 4/1992 | Freiberger et al. | |
| 5,393,683 A | 2/1995 | Mathews et al. | 437/42 |
| 5,470,771 A | 11/1995 | Fujii et al. | 437/43 |
| 5,498,577 A | 3/1996 | Fulford, Jr. et al. | 437/228 |
| 5,538,923 A | 7/1996 | Gardner et al. | 437/238 |
| 5,661,072 A | 8/1997 | Jeng | 438/439 |
| 5,674,788 A * | 10/1997 | Wrister et al. | |
| 5,834,353 A * | 11/1998 | Wu | 438/287 |
| 6,020,024 A * | 2/2000 | Maiti et al. | 438/287 |
| 6,057,584 A * | 5/2000 | Gardner et al. | 257/411 |
| 6,060,755 A * | 5/2000 | Ma et al. | 257/410 |

FOREIGN PATENT DOCUMENTS

| | | | |
|---|---|---|---|
| JP | 01308080 | 12/1989 | H01L/29/78 |
| JP | 02138748 | 5/1990 | H01L/21/336 |
| JP | 02246162 | 10/1990 | H01L/29/788 |
| JP | 04100243 | 4/1992 | H01L/21/336 |
| JP | 04284675 | 10/1992 | H01L/29/788 |
| JP | 06085278 | 3/1994 | H01L/29/788 |
| JP | 07297389 | 11/1995 | H01L/29/78 |
| JP | 09129872 | 5/1997 | H01L/29/78 |
| JP | 09148543 | 6/1997 | H01L/27/115 |
| JP | 09260600 | 10/1997 | H01L/27/108 |
| JP | 10079509 | 3/1998 | H01L/29/78 |
| JP | 10223783 | 8/1998 | H01L/21/8247 |

* cited by examiner

*Primary Examiner*—John F. Niebling
*Assistant Examiner*—Ron Pompey
(74) *Attorney, Agent, or Firm*—Finnegan, Henderson, Farabow, Garrett & Dunner, L.L.P.

(57) ABSTRACT

A method of forming a gate oxide layer in a s conductor device which can obtain low leakage current and high reliability with obtaining effective thickness of 40 Å or lees, is disclosed.

According to the present invention, a NO-oxynitride layer as the bottom oxide layer is formed on a semiconductor substrate and a tantalum oxide layer as the medium oxide layer is thereon. The oxide layer is then formed on the tantalum oxide layer and the substrate is thermal-treated under $N_2O$ gas atmosphere.

13 Claims, 1 Drawing Sheet

METHOD OF FORMING GATE OXIDE LAYER IN SEMICONDUCTOR DEVICE

BACKGROUND OF THE INVENTION

1. Field of the Invention

The present invention relates to a method of manufacturing a semiconductor device, and more particularly to a method of forming a gate oxide layer in a semiconductor device.

2. Description of the Related Art

As high integration, high speed, low voltage and low power consumption of a semiconductor device, a gate oxide thickness grows thinner. The gate oxide is generally formed of a silicon oxide($SiO_2$) having dielectric constant of about 3.85 using thermal oxidation process. However, in this case, as the gate oxide thickness becomes thin, direct tunneling effect is occurred, thereby increasing leakage current.

For solving this problem, one method of forming a gate oxide layer using a stacked layer of a silicon oxide layer and a silicon nitride layer($Si_3N_4$) is suggested. However, since the dielectric constant of the silicon nitride layer is about 7.0, it is difficult to obtain effective gate oxide thickness of 40 Å or less having high reliability and low leakage current.

Therefore, another method of forming a gate oxide layer using a stacked layer of a bottom oxide layer, a tantalum oxide ($Ta_2O_5$) layer having dielectric constant of about 25 higher than the silicon nitride layer and a top oxide layer, is suggested. In detail, a silicon oxide layer as the bottom oxide layer is formed to the thickness of 5 to 20 Å by thermal oxidation, the tantalum oxide layer is formed to the thickness of 30 to 100 Å thereon, a TEOS layer as the top oxide layer is formed to the thickness of 10 to 20 Å, and thermal-treating is performed under $O_2$ atmosphere. In this case, physical gate oxide thickness is 45 to 140 Å, while effective gate oxide thickness is 40 Å or less due to high dielectric constant of the tantalum oxide layer.

However, in case the bottom oxide layer is formed to thin film as described above, its uniformity and reliability are deteriorated. As a result, the barrier property against leakage current and resistance against oxidation of the tantalum oxide layer formed thereon, are deteriorated.

SUMMARY OF THE INVENTION

It is therefore an object of the present invention to provide a method of forming a gate oxide layer in a semiconductor device which can obtain low leakage current and high reliability with obtaining effective gate oxide thickness of 40 Å or less, for solving the problems in the conventional art.

To accomplish this above object, according to the present invention, a NO-oxynitride layer as a bottom oxide layer is formed on a semiconductor substrate and a tantalum oxide layer as a medium oxide layer is then formed thereon. Next, the oxide layer is formed on the tantalum oxide layer. Thereafter, the substrate is thermal-treated under $N_2O$ gas atmosphere.

In this embodiment, the NO-oxynitride layer is formed to the thickness of 5 to 20 Å under NO gas atmosphere by a rapid thermal process or a furnace process. Preferably, the rapid thermal process or furnace process is performed at the temperature of 800 to 850° C. with raising or lowering pressure and the flow rate of the NO gas is 5 to 20 l/min.

Furthermore, the tantalum oxide layer is formed to the thickness of 30 to 150 Å by LPCVD or MOCVD. The top oxide layer is formed to the thickness of 10 to 20 Å using a TEOS layer or a HTO layer.

Moreover, the thermal-treating is performed at the temperature of 800 to 850° C. with raising and lowering pressure by a rapid thermal process or furnace process and the flow rate of the $N_2O$ gas is 5 to 20 l/min.

Additional object, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, a preferred embodiment of the present invention will be explained with reference to accompanying drawings.

Figure 1A:
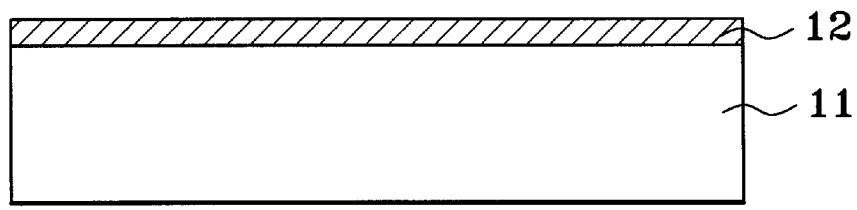
FIG. 1A to FIG. 1C are cross sectional views describing a method of forming a gate oxide layer in a semiconductor device according to an embodiment of the present invention.

Referring to FIG. 1A, an isolating layer (not shown) is formed on a semiconductor substrate 11 of a silicon and a cleaning process is then performed using HF to remove a native oxide layer (not shown) existing on the surface of the substrate 11. A NO-oxynitride layer 12 as a bottom oxide layer is then formed to the thickness of 5 to 20 Å. Preferably, the NO-oxynitride layer 12 is formed under NO gas atmosphere by a rapid thermal process or furnace process. The rapid thermal process of the furnace process is performed at the temperature of 800 to 850° C. with raising or lowering pressure. Preferably, the flow rate of the NO gas is 5 to 20 l/min. Here, since the NO-oxynitride layer 12 has a slow growth rate, it is better in thickness uniformity than the thermal oxide layer of the prior art. Furthermore, the NO-oxynitride layer 12 is formed at the low temperature of 800 to 850° C., thereby decreasing thermal budget. Moreover, owing to nitrogen N consisting in the NO-oxynitride layer 12, the substrate is prevented from oxidizing when performing subsequently thermal process and resistance against hot carrier is improved, thereby improving the barrier property against leakage current.

Figure 1B:
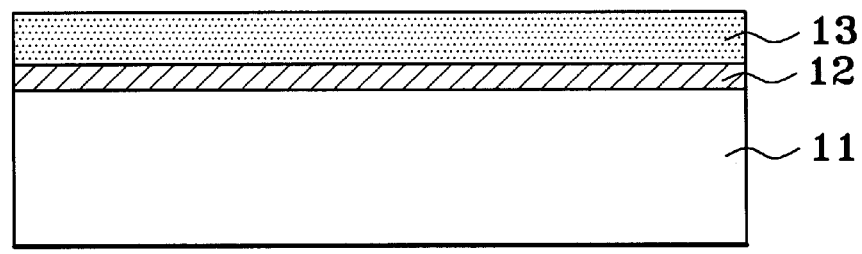

Referring to FIG. 1B, a tantalum oxide($Ta_2O_5$) layer 13 as a medium oxide layer is formed on the NO-oxynitride layer 12 by low pressure chemical vapor deposition(LPCVD) or metal organic CVD(MOCVD). Preferably, the tantalum oxide layer 13 is formed to the thickness of 30 to 150 Å. Here, since the tantalum oxide layer 13 is about 6.5 times higher in dielectric constant than a silicon oxide layer, effective oxide thickness is substantially about 5 to 20 Å.

Figure 1C:
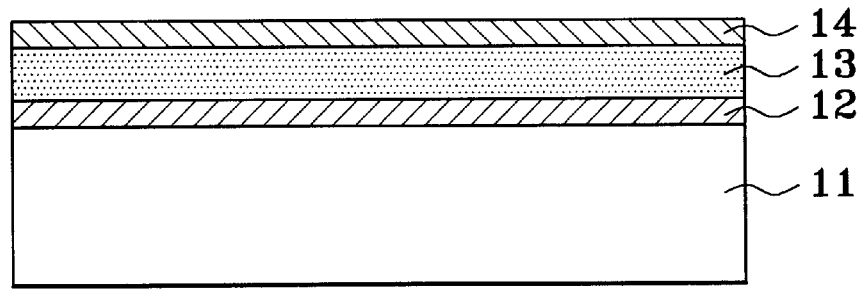

Referring to FIG. 1C, a TEOS layer 14 as atop oxide layer is formed on the tantalum oxide layer 13 by CVD. Preferably, the TEOS layer 14 is formed to the thickness of 10 to 20 Å. Thereafter, thermal-treating is performed by RTP or a furnace process. The RTP or furnace process is performed at the temperature of 800 to 850° C. under $N_2O$ gas atmosphere instead of $O_2$ gas in the prior art, with raising or lowering pressure. Preferably, the flow rate of $N_2O$ gas is 5 to 20 l/min.

As a result, the TEOS layer 14 is nitrified, so that boron penetration is prevented, thereby stabilizing threshold voltage. Furthermore, oxygen vacancy decreases in the tantalum oxide layer 13, so that barrier property against leakage current is improved. Furthermore, thermal-treating is performed at the low temperature of 800 to 850° C., thereby decreasing thermal budget.

On the other hand, a high temperature oxide(HTO) layer can be used as the top oxide layer instead of the TEOS layer 14.

According to the present invention, a gate oxide layer is formed of a stacked layer including a NO-oxynitride layer/a tantalum oxide layer/a TEOS layer and thermal-treating is then performed under $N_2O$ atmosphere, so that it is possible to obtain low leakage current and high reliability with obtaining effective gate oxide thickness of 40 Å or less, thereby improving properties of a device.

Although the preferred embodiment of this invention has been disclosed for illustrative purpose, those skilled in the art will appreciate that various modifications, additions and substitutions are possible, without departing from the scope and spirit of the invention as described in the accompanying claims.

What is claimed is:

1. A method of forming a gate oxide layer with a stacked layer of a bottom oxide layer, a medium oxide layer and a top oxide layer in a semiconductor, comprising the steps of:

forming a NO-oxynitride layer as the bottom oxide layer on a semiconductor substrate, wherein the NO-oxynitride layer is formed under NO gas at a flow rate of 5 to 20 l/min;

forming a tantalum oxide layer as the medium oxide layer on the NO-oxynitride layer, wherein the tantalum oxide layer is formed to a thickness of 30 to 150 Å, and the effective oxide thickness of the tantalum oxide layer is substantially 5 to 20 Å;

forming the top oxide layer on the tantalum oxide layer; and thermal-treating the substrate under a $N_2O$ gas atmosphere.

wherein the effective gate oxide thickness of the gate oxide layer is 40 Å or less.

2. The method according to claim 1, wherein the NO-oxynitride layer is formed to the thickness of 5 to 20 Å.

3. The method according to claim 2, wherein the NO-oxynitride layer is formed by rapid thermal process or furnace process.

4. The method according to claim 3, wherein the rapid thermal process or furnace process is performed at the temperature of 800 to 850° C. with raising or lowering pressure.

5. The method according to claim 1, wherein the tantalum oxide layer is formed by LPCVD or MOCVD.

6. The method according to claim 1, wherein the top oxide layer is formed to the thickness of 10 to 20 Å.

7. The method according to claim 6, wherein the top oxide layer is formed of a TEOS layer.

8. The method according to claim 6, wherein the top oxide layer is formed of a HTO layer.

9. The method according to claim 1, wherein the thermal-treating is performed by rapid thermal process or furnace process.

10. The method according to claim 9, wherein the rapid thermal process or the furnace process is performed at the temperature of 800 to 850° C. with raising or lowering pressure.

11. The method according to claim 10, wherein the flow rate of the $N_2O$ gas is 5 to 20 l/min.

12. A method of forming a gate oxide layer with a stacked layer of a bottom oxide layer, a medium oxide layer and a top oxide layer in a semiconductor, comprising the steps of:

forming a NO-oxynitride layer as the bottom oxide layer on a semiconductor substrate, wherein the NO-oxynitride layer is formed under NO gas atmosphere by rapid thermal process or furnace process performed at a temperature of 800 to 850° C. and the flow rate of the NO gas is 5 to 20 l/min;

forming a tantalum oxide layer as the medium oxide layer on the NO-oxynitride layer;

forming the top oxide layer on the tantalum oxide layer; and thermal-treating the substrate under a $N_2O$ gas atmosphere.

13. A method of forming a gate oxide layer with a stacked layer of a bottom oxide layer, a medium oxide layer and a top oxide layer in a semiconductor, comprising the steps of:

forming a NO-oxynitride layer as the bottom oxide layer on a semiconductor substrate, wherein the NO-oxynitride layer is formed under NO gas atmosphere by rapid thermal process or furnace process performed at a temperature of 800 to 850° C. and the flow rate of the NO gas is 5 to 20 l/min;

forming a tantalum oxide layer as the medium oxide layer on the NO-oxynitride layer;

forming the top oxide layer on the tantalum oxide layer, wherein the top oxide layer is formed of a HTO layer; and thermal-treating the substrate under a $N_2O$ gas atmosphere.

* * * * *